United States Patent [19]

Schneider

[11] Patent Number: 5,552,634

[45] Date of Patent: * Sep. 3, 1996

[54] METHOD AND APPARATUS FOR DISSIPATING HEAT IN AN ELECTRONIC DEVICE

[75] Inventor: Mark R. Schneider, San Jose, Calif.

[73] Assignee: LSI Logic Corporation, Milpitas, Calif.

[*] Notice: The portion of the term of this patent subsequent to Dec. 15, 2009, has been disclaimed.

[21] Appl. No.: 166,713

[22] Filed: Dec. 14, 1993

[51] Int. Cl.$^6$ .................................................. H01L 23/34
[52] U.S. Cl. ...................... 257/706; 257/713; 257/718; 257/722; 361/690; 361/718
[58] Field of Search .................................. 257/720, 706, 257/722, 712, 718, 713, 721; 361/690, 717, 718

[56] References Cited

U.S. PATENT DOCUMENTS

| | | | |
|---|---|---|---|
| 4,092,697 | 5/1978 | Spaight | 361/718 |
| 4,733,293 | 3/1988 | Gabuzda | 257/697 |
| 4,788,627 | 11/1988 | Ehlert et al. | 361/717 |
| 5,172,301 | 12/1992 | Schneider | 257/783 |
| 5,175,612 | 12/1992 | Long et al. | 257/667 |

*Primary Examiner*—Jerome Jackson, Jr.
*Assistant Examiner*—Nathan K. Kelley
*Attorney, Agent, or Firm*—Poms, Smith, Lande & Rose

[57] ABSTRACT

Method and apparatus for cooling an electronic dissipate heat. The method includes the steps of providing a heat sink made from a powdered metal, placing the heat sink in thermal communication with the electronic device and, in one preferred embodiment, circulating an ambient fluid about the heat sink. The heat sink may have a first portion configured to be in thermal communication with the electronic device and a second portion configured to dissipate heat to an ambient fluid. In one preferred embodiment the powdered metal used to form the heat sink includes copper. The powdered metal forming the heat sink may also be at least partially fused. The heat sink structure may be an integral portion of a package for an integrated circuit structure. The heat sink may alternatively be secured to the electronic device with a thermally conductive adhesive. One configuration of the heat sink may include a plurality of posts projecting from a generally flat surface.

26 Claims, 6 Drawing Sheets

F I G. 1B
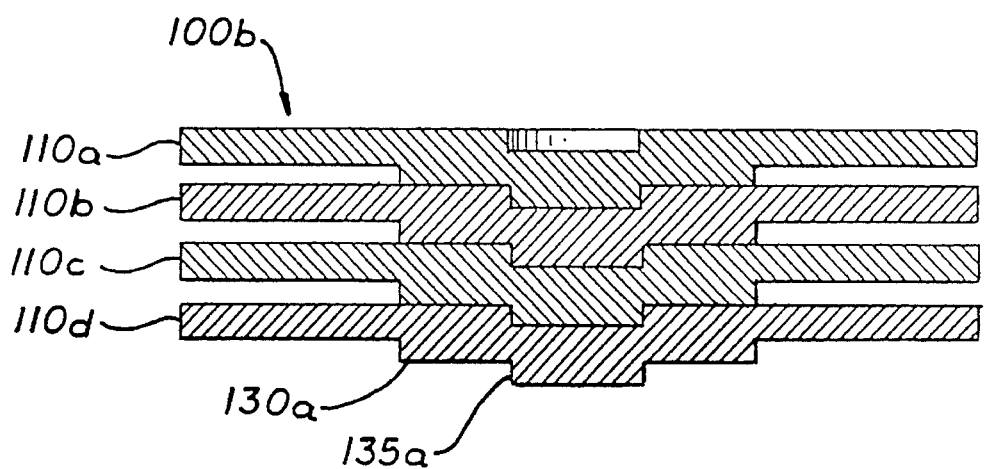
F I G. 1A
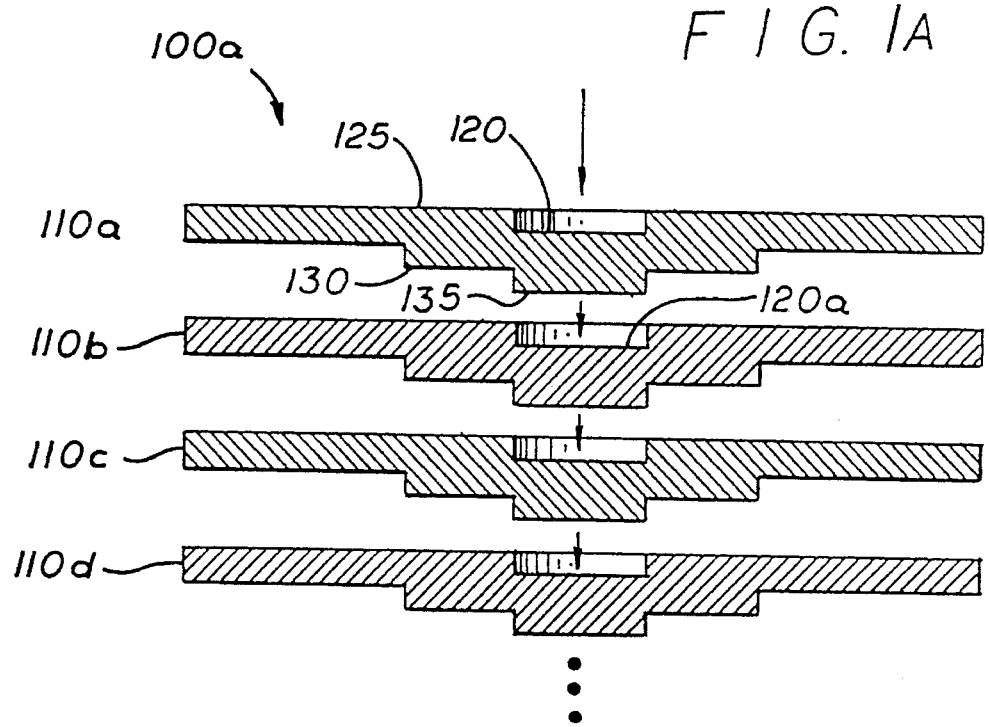
F I G. 2
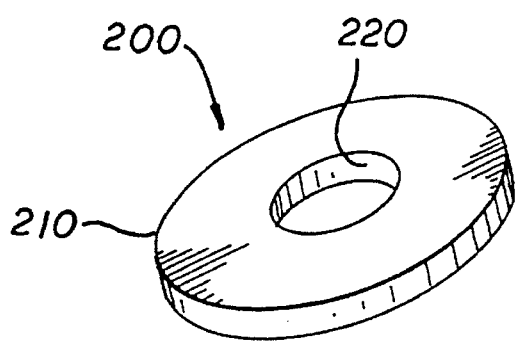
F I G. 3
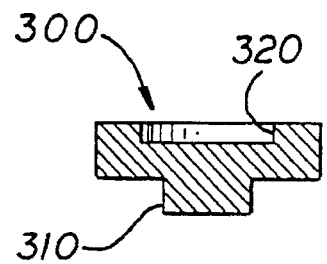

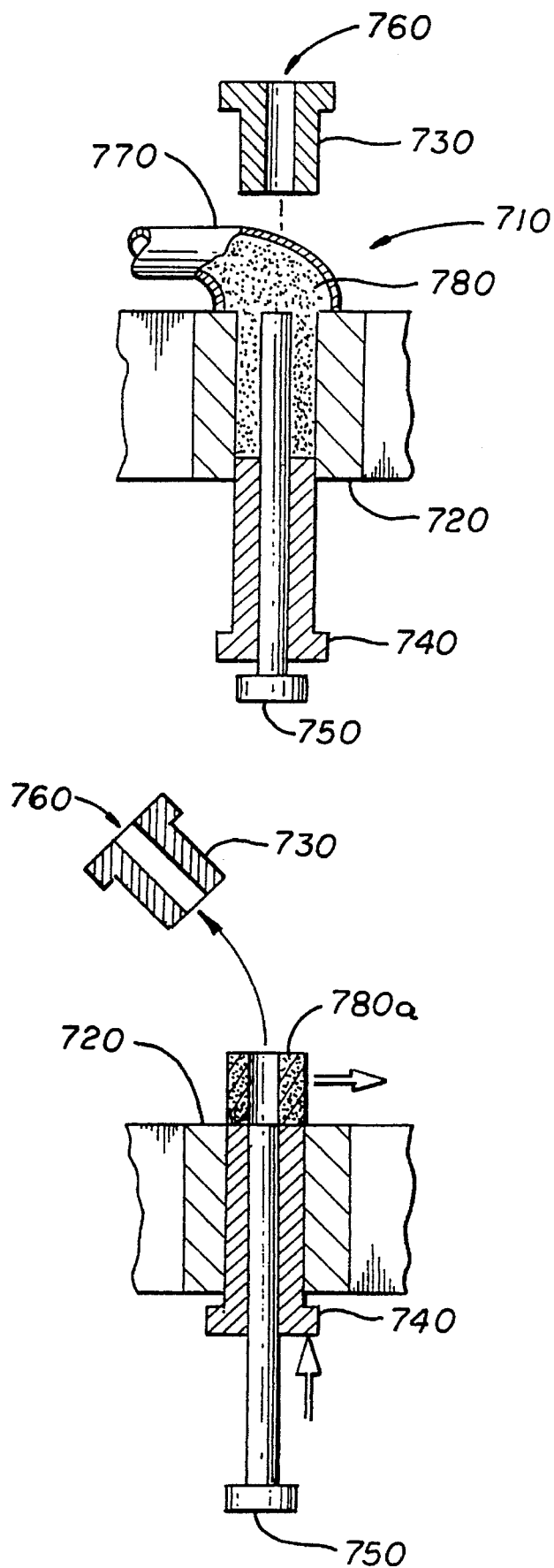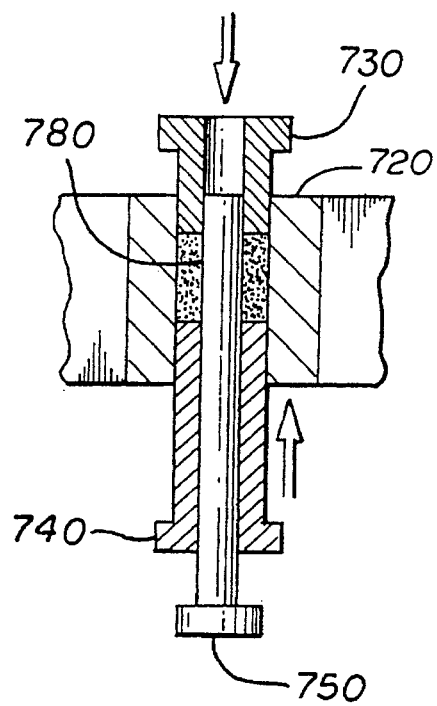
FIG. 7A
FIG. 7B
FIG. 7C

METHOD AND APPARATUS FOR DISSIPATING HEAT IN AN ELECTRONIC DEVICE

FIELD OF THE INVENTION

The present invention relates to electronic systems, integrated circuit and semiconductor devices. More particularly, the present invention relates to methods and apparatus for removing heat generated by integrated circuit structures and devices.

BACKGROUND OF THE INVENTION

Heat is inevitably generated during the operation of integrated circuit devices. In some instances, the amount of heat generated by the device can be sufficient to irreparably damage or even destroy the device. Continuing advances in the number of transistors and other functional elements contained in a single integrated circuit, and the increasingly high speeds at which integrated circuits now operate, both contribute to the problem of integrated circuit heat dissipation. This problem has become so severe, for example, that it is alleged one type of advanced monolithic microprocessor generates sufficient heat in operation to facilitate cooking. Others require that a powered fan be incorporated on them to prevent failure of the device.

It is generally well known to provide some sort of heat sink for semiconductor devices. A variety of methods and devices have been developed for removing at least some heat from an integrated circuit device. Typically a unitary heat sink structure has been used. Heat sinks generally include at least a heat-transferring portion proximate to the semiconductor device for extracting heat therefrom, and a heat-dissipating portion remote from the die With a large surface area for dissipating heat. The heat-dissipating portion is typically formed with a number of parallel layers, through which air passes to remove heat from the heat sink. Typically, the entire heat sink structure may simply be disposed on an exterior of a package, such as on the lid of a lidded package.

While perhaps suitable for Some limited applications, these types of conventional heat sink devices are generally not commercially practical for use except in extreme instances, such as the microprocessor discussed above. Thus there stills exists a continuing need for practical methodologies and devices suitable for providing efficient heat dissipation to increasingly complex integrated circuits. It is believed the present invention fulfills this need.

SUMMARY OF THE INVENTION

It is an object of the present invention to provide an improved heat sink and an improved technique for manufacturing heat sinks.

It is a further object of the invention to provide enhanced methodologies for removing excess heat from integrated circuit devices.

In accordance with one aspect of the present invention, a novel heat sink structure is formed from a plurality of individual and similar stackable layers. The first, bottom most layer in the stack has a gene rally flat top surface with a generally centrally located recess extending into the top surface. The second and subsequent layers in the stack have a top surface similar (e.g., identical, including the recess) to the top surface of the first layer, and have a stepped bottom surface. A first projection extends from the bottom surface of the layer, forming a "shoulder" for a second, smaller projection, extending generally centrally from the first projection, forming a button-like projection from the "shoulder" or first projection. The button-like projection is sized to fit into the recess in the top surface of the previous layer in an interference fit. Because of the interference fit, the second layer is assembled to the first layer by pressing them together under force. This button-like projection of the second layer is then "captured" by the recess in the top surface of the first layer, forming a secure mechanical assembly of the two layers. Subsequent layers may be assembled to the first and second layers in much the same manner. A plurality of layers can be assembled all at once by arranging them in a stack and pressing the entire stack together. In one preferred embodiment the bottom surface of the bottom layer is preferably identical to the bottom surfaces of the remaining layers.

The recess is located generally in the center of the layer on the top surface (side). The "shoulder" is formed on the bottom side of the layer as a generally centrally located region of increased thickness. The button-like projection is disposed generally at the center of the layer, opposite the recess, and extending from the "shoulder" region of increased thickness. Intimate contact between the top surface of one layer and the shoulder of a subsequent layer is sufficient ensures a good thermal path from layer-to-layer.

It should be understood that the button element can be provided on the top surface of the layer and the recess can be provided on the bottom surface of the layer, but this is not necessarily a preferred configuration.

In a preferred embodiment each resulting layer is preferably disc-like, having a circular outline (plan view). However, to better match the Outline of a package (which is typically not circular), the layers can be formed with polygonal or elliptical outlines. This will result in a greater surface area for each layer, within the "footprint" of the package. Similarly, the button-like projection, recess, and "shoulder" can be circular, elliptical, or polygonal. In the event that the outline of the layer is not circular (e.g., square, rectangular, elliptical) then it has an inherent "orientation". In these and other cases it can be advantageous to form non-circular shapes for the button-like projection and recess to provide "keying", or common orientation between layers, or alternatively providing more than one button-like projection.

According to an aspect of the invention, the button element is slightly larger (e.g., in diameter) than the recess. For example, the button element maybe one-half mil larger than the recess. Additionally, the button element may have a taper (draft), for example on the order of 3 degrees. This ensures a snug press fit between the assembled layers. Preferably, the recess is at least as deep as the height of the button-like projection, to ensure complete mating between adjacent layers.

According to a feature of the invention, either the recess or the button may be provided with a groove or hole for permitting potentially entrapped gases (e.g., air) to escape during the press fit procedure.

According to another feature of the invention, a thermally conductive substance, e.g., silicone grease, can be disposed between the assembled layers (e.g., spread on the shoulder of each layer) to improve thermal transfer from layer-to-layer. The use of thermal grease, while advantageous, if allowed to form a film on either the button or the recess may tend increase the necessity for relief grooves or holes to permit entrapped gases to escape during assembly.

The layers are formed of a thermally-conductive material, such as copper, a copper alloy, aluminum, or an aluminum alloy. The topmost layer may have a top surface that is dissimilar from the top layers of the remaining layers, but this is not preferred.

The bottom most layer may have a bottom surface that is dissimilar from the bottom surfaces of the remaining layers, so that the bottom most layer is especially suited to being disposed in close proximity to a semiconductor die or its package, but this is not preferred. For example, the bottom surface of the bottom most layer may be formed to mate with an element of the semiconductor package (see, e.g., FIG. 3 of U.S. Pat. No. 5,175,612, the disclosure of which is hereby incorporated by reference). Alternatively, the bottom surface of the bottom most layer can be identical to the bottom surfaces of the remaining layers, and an adaptor can be interposed between the bottom layers.

According to the invention, any number of layers may be pre-assembled together, prior to mounting to a semiconductor package. In this manner, a wide variety of heat sinks can be formed for different applications from a supply of identical layer elements In use, the layers are assembled together by press fit, and the assembly is mounted directly to a semiconductor die package, such as by gluing (with a thermally-conductive adhesive) to the lid of the package. Alternatively, an "adaptor" may be interposed between the bottom most layer and the semiconductor package. Preferably, the layer are pressed together prior to assembling the heat sink to a semiconductor assembly. Alternatively, a first layer can be assembled to the semiconductor assembly and remaining layers can be pressed into the first in a separate operation. This is not preferred, however, as it may subject the semiconductor package to excessive forces.

Commonly owned U.S. patent application Ser. No. 08/093,292, filed Jul. 15, 1993, provides additional detail regarding suitable heat sinks and manufacturing methods, and its disclosure is hereby incorporated by this reference.

In accordance with a another aspect of the present invention, a heat sink suitable for dissipation of heat from integrated circuit devices is manufactured from a powdered metal. The heat sink may be formed into stackable elements, in accordance with the structural aspect of the invention described above, or it may be formed into other configurations. The inventor has determined powder metal technology is well suited to the manufacture of heat sinks. In contrast to conventional fabrication methods, it is not necessary to form a slab of thermally conductive material and then remove portions of the slab by costly machining steps to achieve a desired shape. The advantages of using powder metallurgy (versus machining solid metal) include eliminating or minimizing machining and eliminating or minimizing scrap losses. The inventor has further determined that suitable thermal transfer efficiencies can be achieved in heat sinks made from powdered metals, despite the typically high porosity and conmitant reduced thermal efficiency of powdered metal artifacts compared to solid metal artifacts formed by conventional machining techniques.

In a preferred embodiment of this aspect of the present invention, a die is provided having a predetermined shape. Powdered metal may then be introduced into the die. The powdered metal may be mixed with suitable binder materials before introducing the mixture into the die. The binders may be selected form any binders known for use in the powder metallurgy art. The powdered metal is then compressed to form a heat sink and may be simultaneously or thereafter sintered at a temperature substantially above room temperature. During the sintering step, the binders may be removed from the heat sink structure.

The die may have two halves, with the powdered metal deposited into a first mold half and with the second mold half being used to compress and shape the powdered metal within the first mold half. Preferably, the pressure during compression is selected from pressures ranges normally used in the industry. The temperature during compression preferably is selected from temperatures commonly used in fabricating structures from the specific powder metal selected. The time and temperature of sintering will also vary with the composition of the powder used, the physical characteristics of the heat sink, and the quantities and types of binders, if any, used. The duration of sintering is at least long enough to produce a structure having desired characteristics, such as an appropriate hardness and thermal conductivity.

Preferred powders for use in accordance with the present invention include copper, aluminum, tungsten, titanium and alloys thereof. In one presently preferred embodiment, the powder is powdered copper, or another metal or metal alloy having a thermal conductivity at least equal to that of copper. Copper has excellent thermal conductivity characteristics, but is generally regarded as far too expensive for use as a heat sink in connection with cooling integrated circuit devices. This is due at least in part to the tedious nature of conventional fabrication processes requiring machining the heat sink structure from a block of solid copper and the associated waste of machined metal. Typically the cost of raw copper stock and conventional machining to form the heat sink structure results in a heat sink for an integrated circuit device which costs as much or more than all but the most expensive integrated circuits. By contrast, through the use of powder metallurgy, powdered copper and related alloys can be used economically, because waste is substantially avoided and the conventional machining steps may be entirely eliminated.

In an alternative embodiment of this aspect of the present invention, the heat sink is initially formed to a first predetermined shape by powder metallurgy, and is then further shaped by machining. This combined manufacturing technique may be used when the ultimate desired shape is one which may not readily be produced by compression of powder metal in a die, but which may be produced by subsequent machining of the compressed powder metal structure.

Still another aspect of the present invention concerns the formation of the novel heat sink structure discussed above from a powdered metal, a powdered metal compound, or a powdered metal alloy. Thus, in this aspect of the present invention the thin layers of the novel heat sink structure discussed may be formed of a powdered metal, or may be formed of stamped out metal. It is also possible to form some of the thin layers from powdered metal and others from stamped metal. When the thin layers of the heat sink are made from powdered metal, they are preferably made in accordance with the second aspect of the present invention described above.

By using the stackable thin configuration of the novel heat sink structure discussed above and powdered metallurgy fabrication techniques, an inexpensive heat sink may be provided from powdered metals whereby inexpensively fabricated heat sink layers are pressed together to construct the desired number of layers which constitute the entire heat sink structure. By using powdered metallurgy fabrication techniques to form the heat sink layers, as opposed to the costly conventional solid metal machining techniques powdered copper and copper related alloys may be used to form the heat sink structure without producing a heat sink that is as expensive as the majority of integrated devices to which it may be applied.

A further aspect of the present invention concerns a novel packaged semiconductor device, wherein the package includes a heat sink made from powdered metal and/or formed in a stackable manner. The heat sink may be manufactured in accordance with any of the methods described herein.

Still a further aspect of the present invention concerns a method of cooling a semiconductor device by providing the device with a powdered metal heat sink that may be formed of the novel stackable structural elements discussed above, and exposing this heat sink structure to a cooling fluid, preferably air. The cooling fluid may be forced past the heat sink by mechanical cooling means, such as a fan, or natural convection may be used. The mechanical cooling means is preferably placed in proximity to the heat sink, and may be mounted directly thereon. This embodiment is most preferably used for semiconductor devices which generate substantial quantities of heat, such as 80486 type microprocessors or processors like Intel's Pentium chip.

From the above summary of the invention, it is clear the present invention provides both novel and nonobvious heat dissipation structures and methodologies suitable for use in connection with cooling integrated circuit devices. Other objects, features and advantages of the invention will become apparent in light of the following detailed description thereof.

BRIEF DESCRIPTION OF THE DRAWINGS

FIG. 1a is a cross-sectional view of four stackable layers of a stacked heat sink assembly, according to the invention, prior to assembly;

FIG. 1b is a cross-sectional view of an assembled heat sink assembly including four layers, according to the invention;

FIG. 2 is a perspective view of a doughnut-shaped adapter, according to the invention;

FIG. 3 is a cross-sectional view of a reducing adapter, according to the invention;

FIGS. 7a–c are an illustration of one preferred method in accordance with the invention for fabricating a powdered metal heat sink;

FIG. 8b is a side view of the heat sink of FIG. 8a.

FIG. 8c is a side view of an alternative structure for the heat sink shown in FIG. 8a.

DETAILED DESCRIPTION OF THE INVENTION

Figure 4:
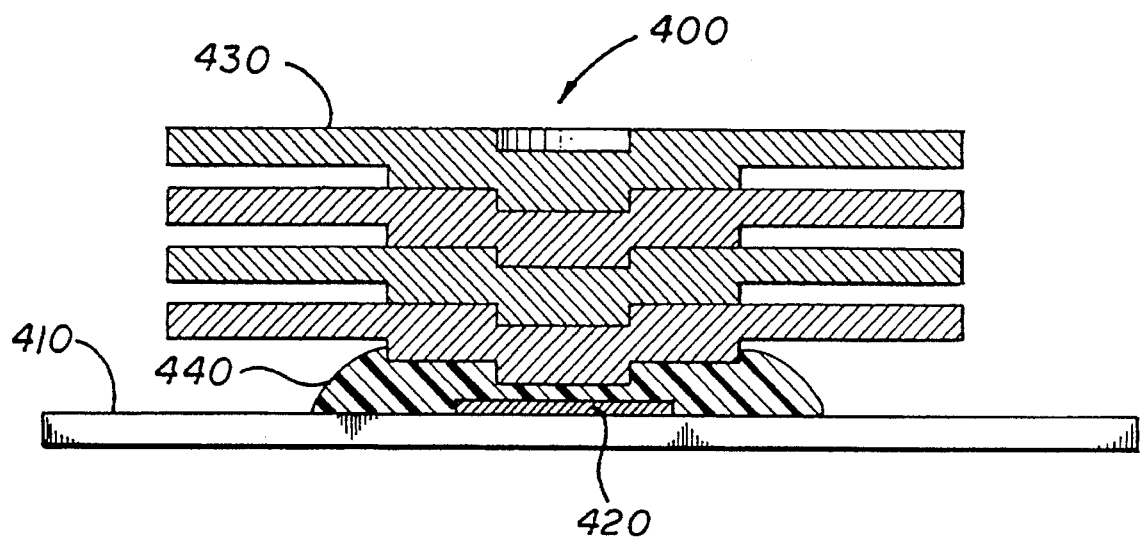
FIG. 4 is a cross-sectional view of an assembly of a stacked heat sink arrangement to a glob-top type package, according to the invention.

In accordance with one aspect of the present invention, a stacked heat sink assembly is formed of a number of individual and stackable layers. A first, bottom most heat sink layer in the stack has a generally flat top surface with a generally centrally located recess extending into the top surface. The second and subsequent layers in the heat sink stack have a top surface similar (or, for example, identical, including the recess) to the top surface of the first layer. These subsequent layers further include a stepped bottom surface. A first projection preferably extends from the bottom surface of the layer, forming a "shoulder" for a second, smaller projection, extending generally centrally from the first projection, forming a button-like projection from the "shoulder" or first projection. The button-like projection is sized to fit into the recess in the top surface of the previous layer in an interference fit.

FIG. 1a shows such an arrangement 100a of heat sink layers prior to assembly. The arrangement 100a includes four layers 100a, 100b, 100c, and 100d. The top-most layer 100a, representative of the others (100b, c, and d) has a substantially flat top surface 125, with a recess 120 formed therein in a generally central location.

A shoulder projection 130 extends from a central region of the bottom surface of the layer 100a. The shoulder region is somewhat thicker (such as twice as thick) as the outer layer region. A button-like projection 135, smaller (in width) than the shoulder projection 130, extends a distance approximately t/2 from a central portion of the shoulder projection 130. The button-like projection 135 is preferably located immediately under (opposite) the recess 120. Although not shown in the Figure, edges of the button-like projection 135 and recess 120 are preferably chamfered, to facilitate inserting the button-like projection 135 of one layer (e.g., 100a) into a recess 120a of the next lower layer (e.g., 100b). The four layers 100a, 100b, 100c, and 110d are shown arranged in a stacked vertical configuration with the button-like projection of one layer positioned above and extending towards the recess of the next lower layer. The direction of assembly is shown with a series of arrows. The button-like projection 135 is slightly larger (e.g., in diameter) than the recess 120. For example, the button element may be one-half mil (0.0005 inches) larger than the recess. Additionally, the button element may have a taper (draft), for example of about 3 degrees. This ensures a snug press fit between the assembled layers. Preferably, the recess is at least as deep as the height of the button-like projection, to ensure complete mating between adjacent layers. In order to assist in fitting the layers together, it is possible to maintain the layer having the exposed recess at a temperature somewhat higher than the layer having the exposed button to be inserted into the recess. This causes the opening of the recess to expand and more readily accept the button.

In another aspect of this embodiment, the assembled layers fit together comparatively loosely, and are assembled together prior to sintering the metal. During the sintering process, the assembled layers may be fused together to produce a heat sink with good thermal conductivity between the layers.

The layers may be formed of powdered metal as discussed more fully below, but may also be formed of stamped out metal. In either case, the layers are preferably formed of a thermally-conductive material such as aluminum, copper, or copper/tungsten. Copper is a preferred choice of metals.

FIG. 1b shows an assembled stacked heat-sink assembly 100b, formed by pressing the arrangement 100a of FIG. 1a together in the direction shown by the arrows. A press fit is formed between the button-like projection of each layer and the recess of the next lower layer. The shoulder projection 130a and button-like projection of the bottom most layer 110d extend from the bottom of the assembly. The shoulder projection (e.g. 130) of each layer is in direct contact with a central region of the top surface of the next lower layer, providing good thermal conductivity therebetween.

In order to further promote thermal conductivity between the layers of the stacked heat sink assembly, it is possible to dispose a small amount of a thermally conductive material, e.g., silicone grease (not shown) between the layers prior to assembly. The thermally conductive material, by increasing thermal contact area and by filling tiny gaps between the shoulder projections and top surfaces of the layers, serves to improve thermal conductivity between the layers.

Although FIGS. 1a and 1b depict an assembly of four layers, any number of the layers equal to or greater than two can be assembled into a similar stacked heat sink assembly.

Each layer is preferably disc-like, having a circular outline (looking down onto the heat sink). However, the layers can also have polygonal or elliptical outlines.

Each button and recess (and shoulder portion) similarly have a circular outline (looking down onto the heat sink). However, the button and recess (and shoulder portion) can also have polygonal or elliptical outlines. In the event that the overall shape (outline) of the layer is not circular (e.g., square, rectangular, elliptical) then it has an inherent "orientation" not found in circles. Accordingly, in such cases it can be advantageous to form non-circular, or otherwise "keyed" shapes for the button-like projection and recess to provide a common, uniform orientation for the assembled layers. Alternatively, however, the layers may be provided with two or more buttons and corresponding recesses arranged in an orientable pattern.

The top-most layer can have a top surface that is dissimilar from the top layers of the remaining layers, but this is not preferred. Similarly, the bottom most layer can have a bottom surface that is dissimilar from the bottom surfaces of the remaining layers, but this is not preferred. It is preferred that each layer is a replication of each other layer.

In use, the layers are assembled together by press fitting, and the assembly can be mounted directly to a semiconductor die package, such as by gluing (with a thermally-conductive adhesive) to an exterior surface of the package.

Alternatively, an "adaptor" may be interposed between the bottom most layer and the semiconductor package. Examples of such adapters are shown in FIGS. 2 and 3.

FIG. 2 is a perspective view of a diameter-increasing, doughnut-shaped adapter 200 Used to increase the effective diameter of a round button-like projection of a layer (e.g., of the bottom most layer). A recess or hole 220, generally centrally located in the adapter 200, is sized and shaped to form an interference fit with a mating button-like projection (e.g., 135a, FIG. 1b). The outer edge 210 of the adapter effectively provides a larger diameter button-like projection from a layer to which the adaptor is assembled. This larger diameter projection can be used, for example to form an interference fit with a large (larger than the button-like projection of the layer) recess in a semiconductor package to which the stacked heat sink is to be assembled.

Additionally, the doughnut-shaped adapter 200 can be used simply to increase the effective surface area (footprint) available for adhesion to (and thermal conduction from) a planar surface of a semiconductor device package, such as to the lid of a lidded package. In this manner (using the adaptor 200), the bottom most layer can have a button of greater effective contact area than the remaining layers, although the bottom most layer is identical to each of the remaining layers.

FIG. 3 is a cross-sectional view of a reducing adapter 300, having a top recess 320 sized to form a press fit (interference fit) with a button-like projection of a layer, and having a smaller button-like projection 310 opposite the recess. This adapter can be used to facilitate a press fit into a package recess which is smaller than the button-like projection of a layer.

Although the adapters 200 and 300 shown and described with respect to FIGS. 2 and 3, respectively are generally assumed to be round in shape, they can also be shaped to accept elliptical or polygonal button like projections, and to provide non-circular button like projections (e.g., 310 FIG. 3) or outer surface shapes (e.g., 210, FIG. 2). In other words, the adapter 200 may have a circular hole 220 for accepting the button of the bottom most layer, and can have a square outline that matches the area of a lid of a lidded package.

It should be understood that the layers may also be secured to one another without using the button-like projections such as button 310 and corresponding recesses such as recess 320 shown in FIG. 3. For example the layers of the heat sink may be bonded together using a thermally conductive adhesive.

Figure 5:
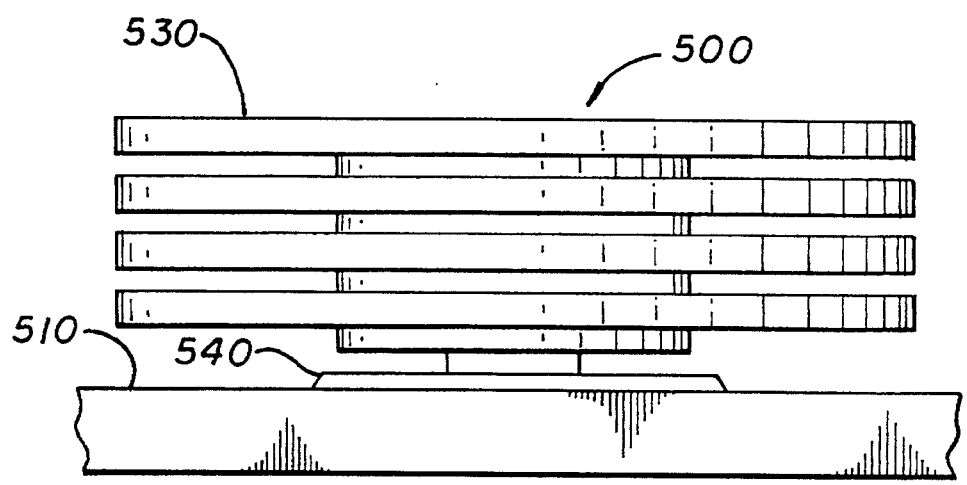
FIG. 5 is a view of an assembly of a stacked heat sink arrangement to a lid of a lidded (e.g., ceramic) semiconductor device package, according to the invention.

FIGS. 4 and 5 show examples of package assemblies incorporating the stacked heat-sink assemblies described hereinabove.

FIG. 4 is a cross-sectional view of a semiconductor package assembly 400 formed on a planar substrate 410. A semiconductor die 420 is attached to the planar substrate (e.g., with a suitable adhesive). Connections (not shown) are formed between the semiconductor die 420 and conductive traces (not shown) on the substrate. A dollop 440 of epoxy or other encapsulant is used to cover the die and its electrical connections. A stacked heat sink assembly 430 (see, e.g., 100b, FIG. 1b) is embedded in the epoxy dollop 440 such that the button-like projection on its bottom surface is in close proximity with the semiconductor die 420, thereby providing means for dissipating heat generated in the operation of the die 420. In operation the heat sink may be exposed to an ambient fluid. In one preferred embodiment this fluid may be air. This ambient fluid may also be circulated past the heat sink to enhance heat dissipation.

FIG. 5 is a side view of another semiconductor package assembly 500 incorporating a stacked heat sink assembly 530. In this case a package 510, such as a ceramic package, with a metallic lid 540 is used. The stacked heat sink assembly is attached by its button-like projection to the lid 540 by using a heat conductive adhesive, thereby providing for heat transfer from the package by conduction from the lid 540. As mentioned above, an adaptor (e.g., 200) can be used to increase the contact area between the bottom most layer and the lid of the package.

While FIGS. 4 and 5 illustrate use of the heat sink in connection with a semiconductor package, it should be understood that the heat sink assembly of the invention may be advantageously used to dissipate heat in a wide variety of electronic systems. For example, the heat sink of the present invention is also suitable for use in connection with "packageless" semiconductor devices and in connection with multichip modules. In the latter structure two or more semiconductor dies may be incorporated into a single package or module.

Figure 9:
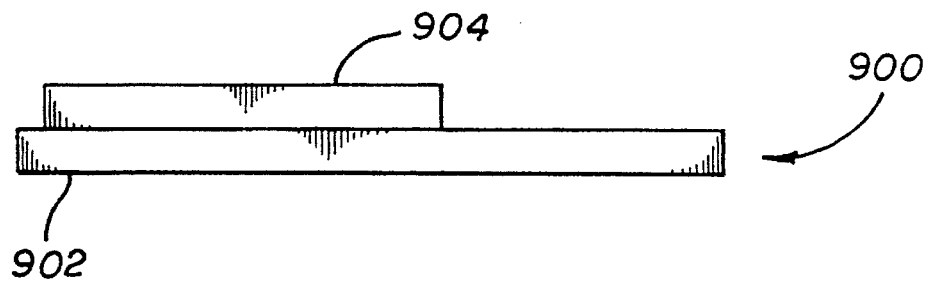
FIG. 9 is a view of an example of a flip chip structure.

The heat sink of the invention may also be used in connection with so called "flip-chip" structures in which two or more semiconductor dies are attached to form a single structure. An example of a flip-chip structure 900 is illustrated in FIG. 9. As shown the structure 900 includes a first semiconductor die 902 having an upper surface on which a second semiconductor die 904 is attached. The area of attachment, that is the common area of contact between the two semiconductor dies normally affords electrically interconnective pathways between the two semiconductor dies.

Accordingly, the heat sink of the invention may be employed in connection with any existing or contemplated electronic systems including integrated circuit devices and semiconductor devices with or without packages, multichip modules, flip-chip devices printed circuit board structures and other forms of electronic components devices and systems that can benefit form being cooled.

Figure 6A:
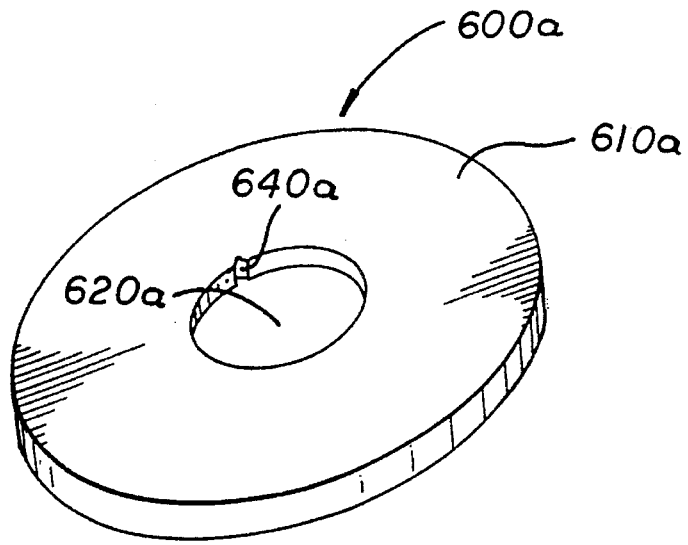
FIG. 6a is a perspective view of a layer incorporating a gas relief groove in the recessed portion thereof, according to the invention.
Figure 6B:
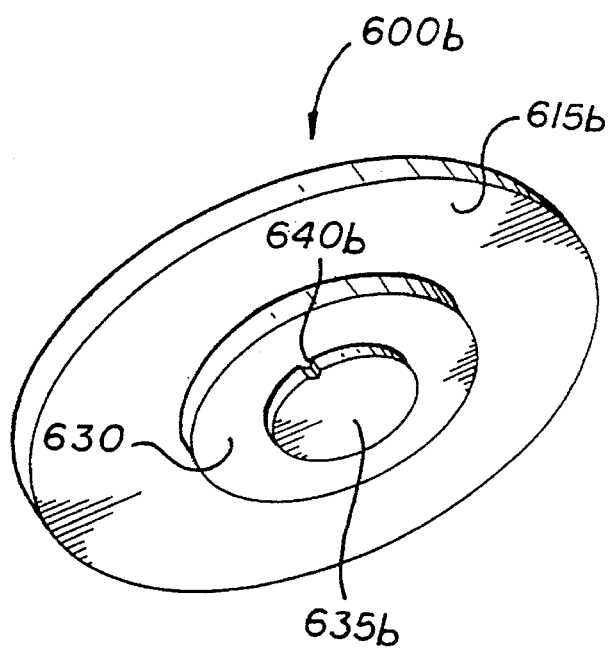
FIG. 6b is a perspective view of a layer incorporating a gas relief groove in the button,like projection portion thereof.
Figure 6C:
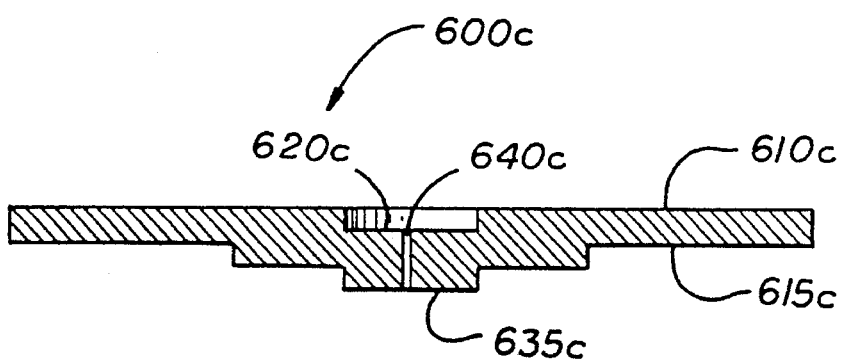
FIG. 6c is a cross-sectional view of a layer incorporating a gas relief hole, according to the invention.

In the process of press-fitting the layers together, it is possible that gases (air) will become entrapped in the recess, especially if thermal grease is used and forms a "sealing" film between the button and the recess. According to a feature of the invention, either the recess or the button may be provided with a groove or hole for permitting entrapped gases (e.g., air) to escape during the press fit procedure. FIGS. 6a–6c show various exemplary embodiments of gas relief grooves and holes.

FIG. 6a is a perspective view of layer 600a, as viewed generally from the top. The top surface 610a of the layer 600a has a recess 620a extending therein, as described hereinabove (e.g., compare 120). A gas-relief groove 640a is formed in the side wall of the recess, providing a path for gas to escape during press fit with a button-like projection of another similar layer.

FIG. 6b is a perspective view of another layer 600b, as viewed generally from the bottom. A shoulder projection 630 extends from the bottom surface 615b of the layer 600b. A button-like projection 635b extends from the shoulder projection 630. A gas-relief groove 640b is formed in the button-like projection 635b to permit gases to escape during press-fit assembly to another similar layer.

FIG. 6c is a cross-sectional view of another layer 600c, illustrating yet another approach to permitting trapped gases to escape during press-fit assembly. The layer 600c (compare 430) has a generally flat top surface 610c. Extending into the top surface 610c is a recess 620c. Extending from a bottom surface 615c of the layer 600c is button-like projection 635c, located directly under the recess 620c. A gas-relief hole 640c extends from the center of the button-like projection completely through the layer 600c to the recess 620c on the opposite side of the layer 600c. The hole 640c is yet another way of permitting trapped gases to escape during press-fit assembly.

Gas-relief holes may not be necessary in all assemblies, since many possible layer designs will not trap enough gas or build up enough pressure to interfere with press-fit assembly or functioning of the stacked heat sink assembly.

According to the invention, any number of layers may be pre-assembled together, prior to mounting to a semiconductor package. In this manner, a wide variety of heat sinks can be formed for different applications from a supply of identical layer elements.

According to an aspect of the invention, the layers are assembled into a stack, so that the resulting heat sink has "n" layers, in accordance to the particular application for which it is intended.

Preferably, the layers are pressed together prior to assembling the heat sink to a semiconductor assembly. Alternatively, a first layer can be assembled to the semiconductor assembly and remaining layers can be pressed into the first in a separate operation. This is not preferred, however, as it may subject the semiconductor package to excessive forces.

As mentioned above, the inventor regards as another aspect of his invention the use of powder metallurgy to form a heat sink structure suitable for integrated circuit device cooling. Powder metallurgy typically involves the production of a metal powder having suitable characteristics and the consolidation of this powdered metal into an artifact by the application of pressure and a simultaneously or subsequent heating operation. This heating operation, commonly referred to as sintering, may but need not necessarily involve the formation of a liquid phase in the powdered metal material. Satisfactory sintering may also be performed below the melting point of all the powdered metal constituents.

Powdered metallurgy is known in the relevant arts, and powdered metal artifacts are available from a number of companies. One such company is the Powder Metallurgy Division Of St. Marys Carbon Company in St. Marys Pa. An illustrative example one process for forming powdered metal artifacts is illustrated in FIGS. 7a–7c. While the process illustrated is deemed suitable for fabricating heat sinks intended for cooling integrated circuit devices, including the novel heat sink structure discussed above, it should be understood that the inventor regards the powdered metal manufacturing process shown in FIGS. 7a–7c, and discussed herein as illustrative only. The present invention is not to be limited to just this illustrative method of fabricating a heat sink from powdered metal compositions and alloys.

Referring to FIG. 7a there is shown an exemplary molding apparatus 710 suitable for the formation of powdered metal artifacts such as the novel heat sink structure discussed above. As illustrated, this apparatus 710 includes a mold form 720 defining a bore configured to receive an upper press 730 and a corresponding lower press 740 in opposing engagement. To facilitate formation of an aperture in the resulting powdered metal artifact, the lower press 740 may include an aperture within which a center pin 750 may be disposed. The upper press 730 may further include an aperture 760 to accommodate the center pin 750.

In operation an appropriate form of shoe 770 is attached to a powdered metal reservoir (not shown) to provide a quantity of powdered metal 780 to the bore of the mold form 720. The shoe 770 is then withdrawn and the opposing upper and lower presses 730 and 740 are forced together with the powdered metal 780 entrapped between the presses, as further illustrated in FIG. 7b. Typically pressures ranging from ten to fifty tons per square inch are used to compact the powdered metals sufficiently to form the desired artifact. Usually larger pressures at the extreme end of this range are required when larger powdered metal artifacts are formed. After application Of pressure to the powdered metal to form the artifact, the unsintered or green artifact 780a is removed from the mold form 720, as illustrated in FIG. 7c. The size of the compacted artifact 780 typically increases from one-half to one and one-half percent when it is ejected from the mold form 720. A significant percentage of force applied to the lower press 740 may thus be required to eject the artifact 780a from the mold form 720. As briefly mentioned above sintering may be performed during or the powdered metal compaction step or after, at temperatures either above or slightly below the melting point of the powdered metal composition or alloy used. Sintering is typically performed in a controlled atmosphere to prevent oxidation of the powdered metal artifact. Hydrogen or disassociated ammonia are typically employed for this purpose. It is believed that the individuals grains of the powdered metal chemically bond together due to the diffusion of atoms at the points of contact among the metal particles, thus forming small contact regions termed "necks". During sintering these contact necks grow larger and develop into metal grain boundaries. Typically the resulting powdered metal artifact is porous, with a density on the order of approximately eighty percent of a comparable solid artifact made from the same material. The size of the powdered metal artifact is also effected by the sintering process. Depending upon the type of powdered metal employed, the dimensions of the final artifact may either expand or contract up to two percent.

As noted above powdered metal artifacts are typically relatively porous. The thermal transfer efficiency of powdered metal artifacts is thus usually significantly less than the thermal transfer efficiency of artifacts made from the same, but solid, metal. Nonetheless, the inventor has determined that heat sinks suitable for integrated circuit device cooling can still be fabricated from powdered metals. In actual testing, the inventor has determined that heat sinks having the flat stacked configuration of the novel heat sink structure discussed above and manufactured using powdered metal copper actually provides substantially greater heat transfer capabilities than comparable structures machined from solid aluminum. In fact, the inventor's testing has shown that heat sinks made from powdered metal copper actually provide greater heat dissipation then solid aluminum heat sinks having even larger heat dissipating structures. More specifically, tests were conducted using an integrated circuit device and heat sinks having the novel stacked layer structure discussed above. Circulating air passed was passed over an exemplary integrated circuit device at the rate of two hundred feet per minute, while a five watt power input was applied to the device. An 8.5° C. increase in temperature per watt input was observed when no heat sink structure was employed on the integrated circuit device. When a solid aluminum heat sink having the configuration discussed above (with four layers) was employed under the same conditions, the integrated circuit device was found to experience a 5.7° C. increase in temperature per watt of power input to the device. Using the solid aluminum heat sink having the configuration discussed above, but with eight layers instead of four, the same testing conditions resulted in a slight lower 4.7° C. increase in temperature of the test integrated circuit per watt of power input. A heat sink manufactured from powdered copper and having a same configuration, but with only three layers, was found to provide such substantially greater cooling efficiency that the test integrated circuit experienced on average only a 3.9° C. increase in temperature per watt of power input to the device. Thus, despite the increased porosity and concomitant reduction in thermal transfer efficiency typically characteristic of powdered metal artifacts, the powdered copper metal heat sink was found to still provide even better cooling for the test integrated circuit device then heat sinks having comparable configurations that were made out of solid metal.

Figure 8A:
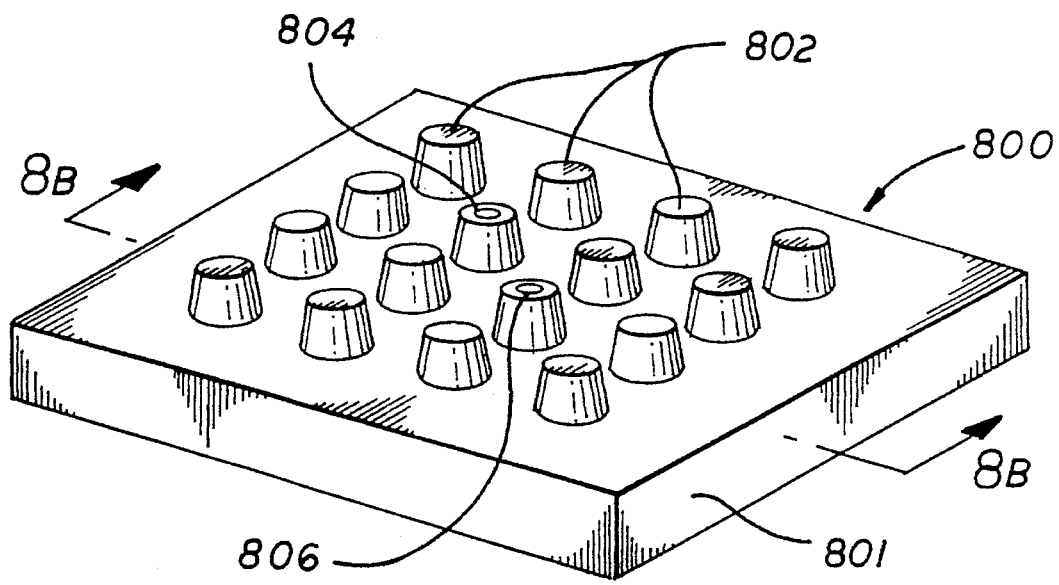
FIG. 8a is a plan view,of a heat sink according to the invention.
Figure 8B:
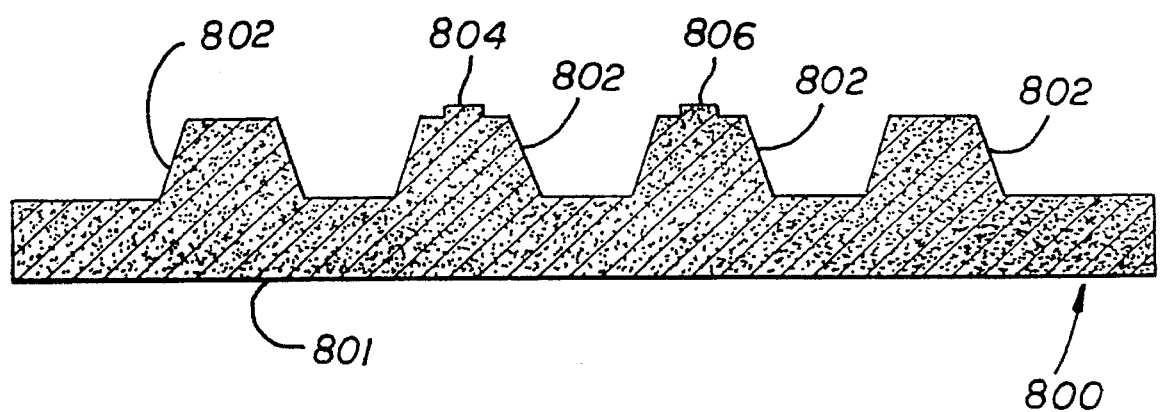

It is important to note that, as stated above, the inventor does not regard the present invention as being limited to the heat sink configurations discussed above. The heat sinks produced from powdered metal in accordance with the present invention may have the shape as shown in FIGS. 1–6, with any number of multiple layers. Alternatively, a heat sink may be formed having the shape illustrated in FIGS. 8a (plan view) and 8b (side view). The heat sink 800 illustrated in FIGS. 8a and 8b has a base 801, which is preferably planar, and a plurality of pegs 802 or other protrusions having a desired shape. The pegs are used to radiate heat away from the slab, by increasing the overall surface area of the heat sink. In use, the slab is preferably placed proximate to or contiguous with a major surface of a semiconductor die, such as the backside of the die. The protrusions may then be exposed to the surrounding air to radiate heat from the packaged semiconductor die.

Figure 8C:
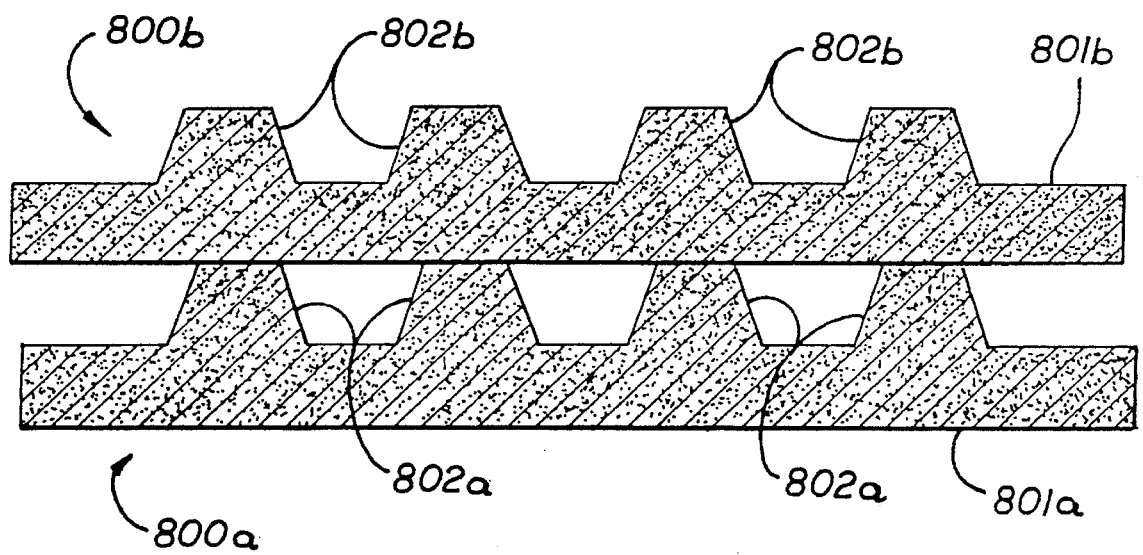

In still a further embodiment of the invention, the heat sink structure 800 may also be stacked to form multiple layers as illustrated in FIG. 8c. As shown a first heat sink 800a is mated with a second heat sink 800b with the base portion 801b of the second heat sink 800b in contact with the posts 802a of the first heat sink 800a. The heat sinks 800a and 800b may be attached to one another using a thermal conductive adhesive of the form know in the relevant arts. Alternatively, however one or more of the post 802 may be provided with protrusions 804 and 806 (shown in FIGS. 8a and 8b), the lower surface of the base portion 801b may be provided with apertures 808 configured to receive these protrusions n preferably, but not necessarily an interference fit. It should be appreciated however, that other methods of attachment could be utilized without departing from the scope or spirit of the present invention.

By using the techniques of the present invention, an inexpensive heat sink is provided using powder metallurgy technology. In one embodiment inexpensive layers are pressed together to construct the desired number of layers which constitute the heat sink whole. Using powder metallurgy, copper may be cost-effectively used as opposed to the costly machining techniques otherwise necessary to form heat sinks from raw metal stock. Normally the cost of raw copper stock and the amount of material lost through machining to form a suitable heat sink structure precludes using solid copper metal as a heat sink. Using powder metallurgy to form the heat sink structure, however, makes the application of powder copper practical for fabrication of heat sinks suitable for use in cooling integrated circuit devices. The heat sink of the present invention thus provides a low-cost, high heat dissipation heat sink suitable for use with a variety o f electronic applications, including heat dissipation of integrated circuit devices, semiconductor devices, multichip modules, printed circuit structures and other forms of electronic components, devices and systems that can benefit from being cooled.

It will, of course, be understood that various modifications and additions can be made to the preferred embodiments of the method and apparatus of the present invention discussed above without departing from the scope or spirit of this invention. Accordingly, the scope of the present invention can not be limited by the particular embodiments discussed above, but should be defined only by the claims set forth below and equivalence thereof.

What is claimed is:

1. A method of cooling a semiconductor device, comprising the steps of providing said semiconductor device with a package including a heat sink consisting essentially of a powdered metal and exposing said heat sink to a cooling fluid;

wherein the heat sink includes a plurality of posts projecting from a generally flat surface, such that at least two of said posts are formed with protrusions extending from ends thereof respectively, and a surface of said heat sink opposite to said generally flat surface is formed with apertures configured to fittingly receive respective protrusions extending from ends of posts of another heat sink which is configured similar to said heat sink.

2. The method of claim 1 wherein the powdered metal includes copper.

3. The method of claim 1 further comprising the step of circulating the fluid to which the heat sink structure is exposed.

4. The method of claim 1 further comprising the step of securing the heat sink to the integrated circuit structure with a thermally conductive adhesive.

5. The method of claim 1 wherein said surface of said heat sink which is opposite to said generally flat surface is also generally flat and extends parallel to said generally flat surface.

6. A method of cooling an integrated circuit device comprising:

contacting the integrated circuit device with a heat sink structure including at least one element formed from a powdered metal; and exposing the heat sink to a heat dissipating fluid wherein the heat sink structure includes a plurality of posts protecting from a generally flat surface, such that at least two of said posts are formed with protrusions extending from ends thereof respectively, and a surface of said heat sink opposite to said generally flat surface is formed with apertures configured to fittingly receive respective protrusion extending from ends of posts of another heat sink which is configured similar to said heat sink.

7. The method of claim 6 further comprising the step of circulating the fluid to which the heat sink structure is exposed.

8. The method of claim 6 wherein the heat sink structure includes elements formed from a powdered metal including copper.

9. The method of claim 6 further comprising the step of securing the heat sink to the integrated circuit device with a thermally conductive adhesive.

10. The method of claim 6 wherein said surface of said heat sink which is opposite to said generally flat surface is also generally flat and extends parallel to said generally flat surface.

11. A method of cooling an electronic device, comprising the steps of:

obtaining a heat sink including at least one element formed from a powdered metal;

placing the electronic device in thermal contact with the heat sink; and exposing the heat sink to a fluid media;

wherein the heat sink includes a plurality of posts protecting from a generally flat surface, such that at least two of said posts are formed with protrusions extending from ends thereof respectively, and a surface of said heat sink opposite to said generally flat surface is formed with apertures configured to fittingly receive respective protrusions extending from ends of posts of another heat sink which configured similar to said heat sink.

12. The method of claim 11 further comprising the step of circulating the fluid media in contact with the heat sink.

13. The method of claim 11 wherein the heat sink is formed from a powdered metal including copper.

14. The method of claim 11 further comprising the step of securing the heat sink to the integrated circuit structure with a thermally conductive adhesive.

15. The method of claim 11 wherein said surface of said heat sink which is opposite to said generally flat surface is also generally flat and extends parallel to said generally flat surface.

16. A packaged semiconductor die, wherein the package comprises a heat sink consisting essentially of powdered metal;

wherein the heat sink includes a plurality of posts projecting from a generally flat surface, such that at least two of said posts are formed with protrusions extending from ends thereof respectively, and a surface of said heat sink opposite to said generally flat surface is formed with apertures configured to fittingly receive respective protrusions extending from ends of posts of another heat sink which is configured similar to said heat sink.

17. The packaged semiconductor of claim 16, wherein the powdered metal includes copper.

18. The packaged semiconductor of claim 16, wherein the heat sink consists essentially of at least partially fused powdered metal particles.

19. An electronic system comprising at least one integrated circuit device with a heat sink structure formed from a powdered metal in thermal communication with said device;

wherein the heat sink includes a plurality of posts projecting from a generally flat surface, such that at least two of said posts are formed with protrusions extending from ends thereof respectively, and a surface of said heat sink opposite to said generally flat surface is formed with apertures configured to fittingly receive respective protrusions extending from ends of posts of another heat sink which is configured similar to said heat sink.

20. The electronic system of claim 19, wherein the powdered metal includes copper.

21. The method of claim 19 wherein said surface of said heat sink which is opposite to said generally flat surface is also generally flat and extend parallel to said generally flat surface.

22. The electronic system of claim 19, wherein the heat sink structure includes at least partially fused powdered metal particles.

23. An electronic device, comprising:

at least one integrated circuit die; and a heat sink in thermal communication with the integrated circuit die and having a portion configured to dissipate heat to an ambient fluid, said heat sink including a portion formed from a powdered metal;

wherein the heat sinks includes a plurality of posts projecting from a generally flat surface, such that at least two of said posts are formed with protrusions extending from ends thereof respectively, and a surface of said heat sink opposite to said generally flat surface is formed with apertures configured to fittingly receive respective protrusions extending from ends of posts of another heat sink which is configured similar to said heat sink.

24. The electronic device of claim 23, wherein the powdered metal includes copper.

25. The method of claim 23 wherein said surface of said heat sink which is opposite to said generally flat surface is also generally flat and extends parallel to said generally flat surface.

26. The electronic device of claim 23, wherein the heat sink structure includes at least partially fused powdered metal particles.

* * * * *